(12) United States Patent
Lacroix et al.

(10) Patent No.: US 9,029,296 B2
(45) Date of Patent: May 12, 2015

(54) INCREASED NORMAL ZONE PROPAGATION VELOCITY IN SUPERCONDUCTING SEGMENTS

(71) Applicant: Polyvalor, Limited Partnership, Montreal (CA)

(72) Inventors: Christian Lacroix, Montreal (CA); Frederic Sirois, Montreal (CA); Michael Robert Wertheimer, Westmount (CA)

(73) Assignee: Polyvalor, Limited Partnership, Montreal, Quebec (CA)

( * ) Notice: Subject to any disclaimer, the term of this patent is extended or adjusted under 35 U.S.C. 154(b) by 0 days.

(21) Appl. No.: 14/376,200

(22) PCT Filed: Feb. 1, 2013

(86) PCT No.: PCT/CA2013/050080
§ 371 (c)(1),
(2) Date: Aug. 1, 2014

(87) PCT Pub. No.: WO2013/113125
PCT Pub. Date: Aug. 8, 2013

(65) Prior Publication Data
US 2015/0045231 A1    Feb. 12, 2015

Related U.S. Application Data

(60) Provisional application No. 61/953,914, filed on Feb. 2, 2012.

(51) Int. Cl.
*H01L 39/06*      (2006.01)
*H01L 39/16*      (2006.01)
(Continued)

(52) U.S. Cl.
CPC ............... *H02H 7/001* (2013.01); *H01L 39/16* (2013.01); *H01L 39/06* (2013.01); *H01L 39/24* (2013.01); *H02H 9/02* (2013.01)

(58) Field of Classification Search
CPC .................... H01L 39/06–39/16; H01B 12/06
See application file for complete search history.

(56) References Cited

U.S. PATENT DOCUMENTS 6,552,415 B1 *   4/2003   Paul et al. ..................... 257/661
6,830,776 B1 *   12/2004   Barnes et al. ................... 427/63
(Continued)

FOREIGN PATENT DOCUMENTS

CA     2060921     2/1992
DE     10163008     9/2002
(Continued)

OTHER PUBLICATIONS

Mints et al., "Quench propagation velocity for highly stablized conductors", 1993, Butterworth, Heinemann Ltd., vol. 33, pp. 449-453.
(Continued)

*Primary Examiner* — Colleen Dunn
(74) *Attorney, Agent, or Firm* — Norton Rose Fulbright Canada LLP (57) ABSTRACT

There is described herein a superconducting segment and method of making same comprising one or several layers with very high electrical resistivity, acting as a current flow diverter when the current transfers from the superconductor to the stabilizer. The purpose of this current flow diverter is: i) to increase the contact resistance between the superconductor and the stabilizer, by reducing the contact area, and ii) to force the current to flow along a specific path, so as to increase momentarily the current density in a specific portion of the stabilizer. The consequence of i) and ii) is that heat generated at the extremities of the normal zone is increased and spread over a longer length along the superconducting segment, which increases the NZPV and thus, the uniformity of the quench.

16 Claims, 9 Drawing Sheets

(51) Int. Cl.
*H02H 7/00* (2006.01)
*H01L 39/24* (2006.01)
*H02H 9/02* (2006.01)

(56) References Cited

U.S. PATENT DOCUMENTS

| | | | | |
|---|---|---|---|---|
| 7,109,151 B2 * | 9/2006 | Lee et al. | ............ | 505/237 |
| 7,627,356 B2 * | 12/2009 | Zhang et al. | ............ | 505/231 |
| 7,756,557 B1 * | 7/2010 | Barnes et al. | ............ | 505/231 |
| 8,275,431 B2 * | 9/2012 | Usoskin et al. | ............ | 505/230 |

FOREIGN PATENT DOCUMENTS

| | | |
|---|---|---|
| DE | 10225935 | 1/2004 |
| EP | 1788641 | 5/2007 |
| EP | 2192629 | 6/2010 |
| EP | 2284918 | 2/2011 |

OTHER PUBLICATIONS

Mints et al., "Enhanced Quench propagation Velocity", IEEE Transactions on Applied Superconductivity, vol. 3, No. 1, Mar. 1993, pp. 654-657.

A. M. Wolsky; Talk given at Meeting of the ExCo of the IEA Implementing Agreement for a Co-Operative Programme for Assessing the Impacts of High-Temperature Superconductivity on the Electric Power Sector, Zurich, Switzerland (Oct. 4-6, 2010).

R. Grabovickic et al.; "Measurements of Temperature Dependence of the Stability and Quench Propagation of a 20-cm-Long RABiTS Y—Ba—Cu—O Tape", IEEE Transactions on Applied Superconductivity, vol. 13, No. 2, Jun. 2003.

F. Trillaud et al.; "Protection and Quench Detection of YBCO Coils Results With Small Test Coil Assemblies", IEEE Transactions on Applied Superconductivity, vol. 17, No. 2, Jun. 2007.

X. Wang et al.; "Near-adiabatic quench experiments on short YBa2Cu3O7-δ-coated conductors", J. Appl. Phys. 101, 053904 (2007).

E. Young et al.; "Quench Characteristics of a Stabilizer-Free 2G HTS Conductor", IEEE Transactions on Applied Superconductivity, vol. 19, No. 3, Jun. 2009.

G. A. Levin et al.; "The normal zone in YBa2Cu3O6+x-coated conductors", Superconductor Science and Technology, Sep. 2007.

W. K. Chan et al.; "Three-Dimensional Micrometer-Scale Modeling of Quenching in High-Aspect-Ratio YBa2Cu3O7-δ-Coated Conductor Tapes—Part I: Model Development and Validation", IEEE Transactions on Applied Superconductivity, vol. 20, No. 6, Dec. 2010.

G. A. Levin et al.; "Stability and Normal Zone Propagation Speed in YBCO Coated Conductors With Increased Interfacial Resistance", IEEE Transactions on Applied Superconductivity, vol. 19, No. 3, Jun. 2009.

F. Roy; "Modeling and Characterization of Coated Conductors Applied to the Design of Superconducting Fault Current Limiters", These No. 4721, Ecole Polytechnique Federale de Lausanne, May 2010.

A.A. Akhmetov et al.; "Propagation of the normal zone in composite superconductors with high contact resistance", J. Phys. D: Appl. Phys. 18 (1995), 925-938.

G.A. Levin et al.; "The effects of superconductor-stabilizer interfacial resistance on the quench of a current-carrying coated conductor", Superconductor Science and Technology 23, Dec. 2009.

S.E. Russek et al.; "Surface degradation of superconducting YBa2Cu3O7-δ thin films", Electromagnetic Technology Division, National Institute of Standards and Technology, Boulder, Colorado, Apr. 1994.

M.R. Wertheimer et al.; "Reduction of niobium pentoxide in a hydrogen discharge", Ecole Polytechnique de Montreal, J. Vac. Sci. Technol., vol. 14, No. 2, Mar./Apr. 1977.

M.R. Wertheimer et al.; "Reduction of transition metal oxides in a hydrogen plasma", Ecole Polytechnique de Montreal, 1977.

L.A. MacQueen et al.; "PECVD of Nanocrystalline Si Layers on High-Tg Polymer Substrates", Plasma Processes and Polymers, vol. 3, pp. 58-65, 2006.

\* cited by examiner

INCREASED NORMAL ZONE PROPAGATION VELOCITY IN SUPERCONDUCTING SEGMENTS

CROSS-REFERENCE TO RELATED APPLICATIONS

This application claims priority under 35 U.S.C. §119(e) from U.S. Provisional Patent Application No. 61/593,914, filed on Feb. 2, 2012, the contents of which are hereby incorporated by reference.

TECHNICAL FIELD

The present invention relates to the field of superconductors and more particularly, to an architecture for superconducting segments for addressing the issue of non-uniform quenching and the appearance of destructive hot spots.

BACKGROUND OF THE ART

Superconductors are materials that conduct electricity without resistance, when i) they are cooled below a temperature called the critical temperature ($T_c$), ii) a magnetic field applied to the superconductor is less than the critical field ($B_c$), and iii) the current density in the superconductor is less than the critical current density ($J_c$). Superconductors are used in applications such as electromagnets, fault current limiters (FCLs), motors, etc. The advantages of using superconductors over conventional conductors, such as copper or aluminum, are weight reduction, compactness, production of higher magnetic fields (electromagnets), increased protection level and reliability of supply in power systems (FCLs), etc. Some applications, such as resistive superconducting FCLs, which aim to protect electrical equipment in the electrical grid, are based on the "quench" of the superconductor. Quench is the transition from the superconducting to the normal state by heat generation, when the temperature (T) rises above $T_c$. If a fault occurs in the grid, the line current increases to several times the nominal value and the current density in the superconductor exceeds $J_c$. The superconductor then becomes resistive and the energy dissipation raises its temperature, T. When T reaches $T_c$, the superconductor becomes normal and its resistivity becomes very high, even compared with that of normal metals like copper (Cu) or silver (Ag). To the electrical network, this is seen as a sudden insertion of high impedance in series with the source, which reduces the line current and enables the device to protect expensive electrical equipment downstream.

Second generation (2G) high temperature superconducting (HTS) coated conductors (CC) consist of a metal substrate, with deposited oxide layers (buffer layers), on which the superconductor is grown (typically $YBa_2Cu_3O_{7-x}$). All this is surrounded by a metal coating (typically Ag or Cu), which acts as a stabilizer by i) providing an alternative current path when the superconductor becomes normal, and ii) acting as a heat sink. These segments possess excellent properties (high critical current density with or without magnetic field, and high mechanical strength). When a quench occurs in 2G HTS CC, the current transits to the stabilizer. Unfortunately, when the applied current is near $I_c=J_cA$ (A being the superconductor's cross-sectional area), hot spots (rapid increases of local temperature) can appear and eventually can destroy the 2G HTS CC. The appearance of hot spots is the result of a combination of factors. First, there is a variation of $J_c$ along the segment, between 10 to 20% around the mean value. This variation of $J_c$ is unavoidable in the current fabrication processes. As a consequence, when the applied current density in the 2G HTS CC is close to $J_c$, the quench is non-uniform, meaning that the weakest zones of the superconducting layer become normal while the rest of the segment remains superconducting. In this case, the current transits to the stabilizer only where the superconductor is normal, since the current follows the path of least resistance. The segment becomes fully quenched when the initial normal zone expands to the entire length of the superconducting layer (the superconductor is then said to be "fully quenched"). The growth rate of the normal zone determines what is called the normal zone propagation velocity (NZPV). The other factor responsible for the appearance of hot spots is the very low NZPV of 2G HTS CC that is due to the low thermal conductivity of the 2G HTS CC. As a result, the temperature of the initial normal zone can increase drastically before the segment becomes fully quenched, which can destroy the segment and render it unusable. This local region in the superconductor where the temperature increases drastically is called a hot spot. From an application point of view, it is critical to avoid the appearance of hot spots, to prevent the deterioration of the device. The common strategy adopted so far has been to increase the thickness of the stabilizer just enough, so as to avoid destroying the segment when a hot spot nucleates, but with the accompanying drawback of an increased production cost, and a loss of fault current limitation capability. The hot spot issue exists in all devices based on 2G HTS CCs, but it is more critical in the case of FCLs.

Therefore, there is a need to address the problem of non-uniform quenching of the superconductor and hot spots in 2G HTS CC.

SUMMARY

There is described herein a method for reducing non-uniform quenching in superconductors by enhancing the normal zone propagation velocity (NZPV). The NZPV can be enhanced by increasing the contact resistance between the superconductor and the stabilizer. The contact resistance is the electrical resistance seen by the current when passing from the superconductor to the stabilizer. The contact resistance is defined on the basis of a unit length of a superconductor segment. The consequence of the increased contact resistance is that the current transfer length is also increased, which has the effect of distributing heat generation over a larger region along the segment and to enhance the NZPV. The NZPV can also be enhanced by increasing the heat generation at the interface between the normal and superconducting zone in the superconductor. This is the case when the current is concentrated in the superconductor-stabilizer interface at the moment when the current is transiting from the superconductor to the stabilizer.

There is also described herein an architecture for a superconducting segment comprising a layer with very high electrical resistivity, which acts as a current flow diverter when the current transits from the superconductor to the stabilizer. The purpose of this current flow diverter is to increase the NZPV by way of two phenomena. First, the current flow diverter increases the contact resistance between the superconductor and the stabilizer by reducing their contact area; this results in an increase of the current transfer length and a more extended distribution of heat generation along the segment's length, which in turn increases the NZPV. Second, it forces the current to remain momentarily confined to a given portion of the stabilizer when the current transfers from the superconductor to the stabilizer. This leads to controlled heat generation at a well defined location that partially quenches the cross-section of the superconductor, bringing it into an even more resistive (dissipative) state, which further increases the NZPV and greatly reduces the risk of a hot spot.

The described method and architecture are rather counter-intuitive since they increase the heat generation (through the Joule effect) when the current transits from the superconductor to the stabilizer, whereas it is usually thought that heat generation should be minimal to avoid the destruction of the segment. The method and architectures are applicable to different types of superconducting segments (or wires) such as 2G HTS CC and others.

Note that when a temperature T is below a critical temperature $T_c$, the resistance of the superconductor is close to zero, the current flow diverter shows a resistance higher than the resistance of the superconductor and the stabilizer, and the stabilizer shows a resistance higher than the resistance of the superconductor and lower than the resistance of the current flow diverter. In addition, when T is equal to or above $T_c$, there is a transition from superconducting to normal state within the superconductor. In that case, the resistance of the superconductor in the normal state is still lower than the resistance of the current flow diverter, but the stabilizer shows a resistance lower than the resistance of the superconductor in the normal state and that of the current flow diverter. Furthermore, for a given NZPV value, the local region of contact between the stabilizer and the superconducting layer reduces the contact resistance. This results in reduced heat generation during the quench and increased thermal stability under small perturbations.

In accordance with a first broad aspect, there is provided a superconducting segment comprising: a substrate; a superconducting layer on the substrate, having a width and made of a material that undergoes a transition from a superconducting state to a normal state when its temperature (T) rises beyond a critical temperature ($T_c$); a stabilizer having an electrical resistance greater than the superconducting layer when T is below $T_c$ and lower than the superconducting layer when T is equal to or above $T_c$, and having an inner surface at least partly in contact with the superconducting layer and having an opposed outer surface; and a current flow diverter having a greater electrical resistance than the stabilizer when T is below $T_c$, and located between the stabilizer and the superconducting layer or inside the stabilizer, the current flow diverter extending between the superconducting layer and the outer surface of the stabilizer along at least a portion of the width of the superconducting layer and having a first contact resistance along the portion of the width, and defining at least one current path from the superconducting layer to the outer surface of the stabilizer having a second contact resistance lower than the first contact resistance.

In accordance with another broad aspect, there is provided a method for reducing non-uniform quenching in a superconducting segment, the superconducting segment having a substrate, a superconducting layer on the substrate made of a material that undergoes a transition from a superconducting state to a normal state when its temperature (T) rises beyond a critical temperature ($T_c$), and a stabilizer, the method comprising diverting current flowing through the superconducting layer into the stabilizer, when the superconducting layer is in the normal state, through at least one current path defined by a current flow diverter between the stabilizer and the superconducting layer or inside the stabilizer, the current flow diverter extending along at least a portion of the width of the superconducting layer, having a greater electrical resistance than the stabilizer when T is below $T_c$, and having a first contact resistance along the portion of the width, and the at least one current path having a second contact resistance lower than the first contact resistance.

In accordance with yet another broad aspect, there is provided a method of fabricating a superconducting segment, the method comprising: depositing a superconducting layer on a substrate, the superconducting layer having a width and made of a material that undergoes a transition from a superconducting state to a normal state when its temperature T rises beyond a critical temperature $T_c$ providing a stabilizer at least partly in contact with the superconducting layer, the stabilizer having an electrical resistance greater than the superconducting layer when T is below $T_c$ and lower than the superconducting layer when T is equal to or above $T_c$; and providing a current flow diverter having a greater electrical resistance than the stabilizer when T is below $T_c$, and located between the stabilizer and the superconducting layer or inside the stabilizer, the current flow diverter extending between the superconducting layer and the outer surface of the stabilizer along at least a portion of the width of the superconducting layer and having a first contact resistance along the portion of the width, and defining at least one current path from the superconducting layer to the outer surface of the stabilizer having a second contact resistance lower than the first contact resistance.

In the present specification, when illustrating a top cross-sectional view of the superconducting segment, block arrows represent the current as it flows through the superconducting segment, solid lines represent the current flowing in the plane of the top cross-sectional view, and dashed lines represents the current flowing in the stabilizer, above and below the superconducting layer. When illustrating a longitudinal cross-sectional view of the superconducting segment, solid lines represent the current flowing in the plane of the longitudinal cross-sectional view while dashed lines represent the current flowing in the stabilizer, on the segment's edges.

BRIEF DESCRIPTION OF THE DRAWINGS

Further features and advantages of the present invention will become apparent from the following detailed description, taken in combination with the appended drawings, in which:

FIG. 2b is a cross-sectional top view showing the flow of current from the superconductor to the stabilizer of the superconducting segment of FIG. 2a;

FIG. 2c is a cross-sectional longitudinal view showing the flow of current from the superconductor to the stabilizer of the superconducting segment of FIG. 2a;

FIG. 2d is a cross-sectional transverse view showing the flow of current from the superconductor to the stabilizer of the superconducting segment of FIG. 2a;

FIG. 3b is a cross-sectional top view showing the flow of current from the superconductor to the stabilizer of the superconducting segment of FIG. 3a;

FIG. 3c is a cross-sectional longitudinal view showing the flow of current from the superconductor to the stabilizer of the superconducting segment of FIG. 3a;

FIG. 3d is a cross-sectional transverse view showing the flow of current from the superconductor to the stabilizer of the superconducting segment of FIG. 3a;

FIG. 4b is a cross-sectional top view showing the flow of current from the superconductor to the stabilizer of the superconducting segment of FIG. 4a;

FIG. 4c is a cross-sectional longitudinal view showing the flow of current from the superconductor to the stabilizer of the superconducting segment of FIG. 4a;

FIG. 4d is a cross-sectional transverse view showing the flow of current from the superconductor to the stabilizer of the superconducting segment of FIG. 4a;

FIG. 5b is a cross-sectional top view showing the flow of current from the superconductor to the stabilizer of a superconducting segment of FIG. 5a;

FIG. 5c is a cross-sectional longitudinal view showing the flow of current from the superconductor to the stabilizer of a superconducting segment of FIG. 5a;

FIG. 5d is a cross-sectional transverse view showing the flow of current from the superconductor to the stabilizer of a superconducting segment of FIG. 5a;

It will be noted that throughout the appended drawings, like features are identified by like reference numerals.

DETAILED DESCRIPTION

Figure 1A:
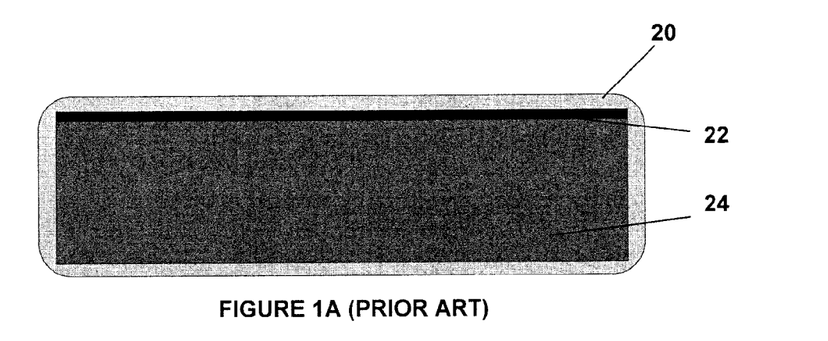
FIG. 1a illustrates a cross-sectional transverse view of a superconducting segment as per the prior art (buffer layers not shown)
Figure 1B:
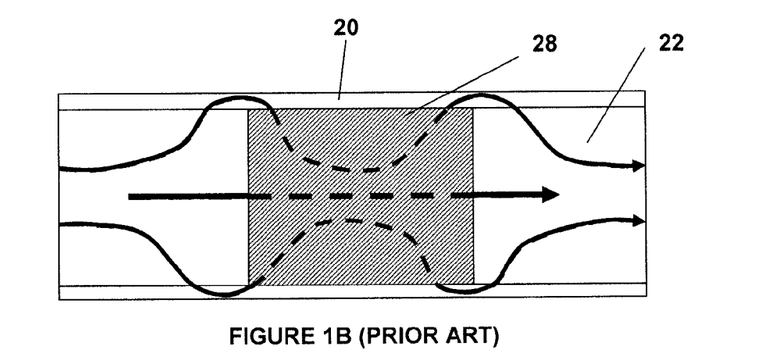
FIG. 1b is a cross-sectional top view of a superconducting segment as per the prior art, showing the flow of current from the superconductor to the stabilizer.
Figure 1C:
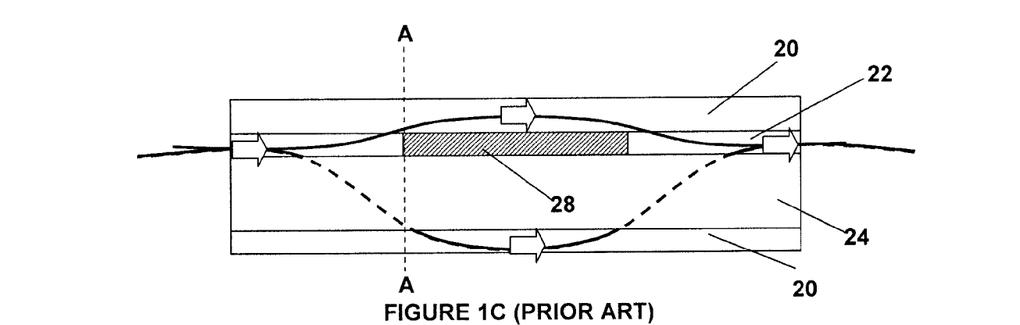
FIG. 1c is a cross-sectional longitudinal view of a superconducting segment as per the prior art, showing the flow of current from the superconductor to the stabilizer.
Figure 1D:
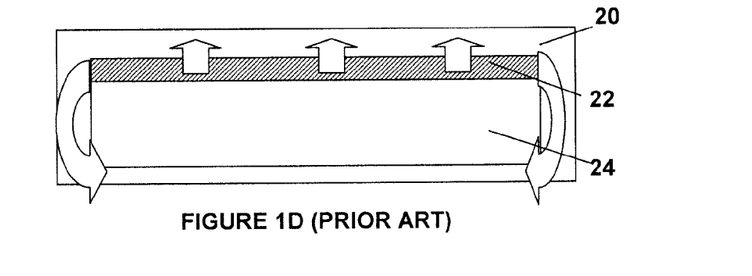
FIG. 1d is a cross-sectional transverse view of a superconducting segment as per the prior art, showing the flow of current from the superconductor to the stabilizer.

FIGS. 1a to 1d illustrate a superconducting segment as per the prior art. As shown in FIG. 1a, a transverse cross-sectional view of the superconducting segment, a buffer/substrate layer 24 is covered by a high temperature superconducting layer 22, the whole being then covered and surrounded by a stabilizer 20. This architecture presents a non-uniform quench when the applied current is near $I_c = J_c A$ (A being the superconductor's cross-sectional area), which, in combination with its low NZPV, can cause the appearance of destructive hot spots. FIG. 1b is a top cross-sectional view of the superconducting segment, illustrating the normal zone 28 of the superconductor. The arrows represent the current as it flows through the superconducting segment. The solid line represents the current flowing in the plane of the top cross-sectional view while the dashed line represents the current flowing in the stabilizer, above and below the superconducting layer. FIG. 1c is a longitudinal cross-sectional view of the superconducting segment of FIG. 1a. The solid line represents the current flowing in the plane of the longitudinal cross-sectional view while the dashed line represents the current flowing in the stabilizer, on the segment's edges. The current, when it arrives at the normal zone 28, flows into the stabilizer layer 20 and returns to the superconducting layer 22 after the normal zone 28. A certain fraction of the total current, generally small and negligible, also flows in the resistive substrate 24 (not shown in the figures). FIG. 1d is a cross-sectional view along lines A-A of FIG. 1c, showing the current's path from the superconducting layer 22 to the stabilizer 20.

In order to increase the NZPV, i.e. to render the quench uniform, a current flow diverter is inserted into the device. The current flow diverter is embodied by a specifically designed, highly resistive layer, as will be described in more detail below. The presence of the current flow diverter increases the contact resistance between the superconductor 22 and the stabilizer 20 by reducing the contact area between the two. This results in an increase of the current transfer length and a more extended distribution of heat generation along the segment's length, which in turn increases the NZPV. Also, the current flow diverter forces the current to flow along a specific path by creating current paths for current flow at specific locations, so as to concentrate it for a short time to within a certain portion of the stabilizer 20 when the current is transiting from the superconducting layer 22 to the stabilizing layer 20. The current paths have a lower contact resistance than the contact resistance between the superconductor 22 and the stabilizer 20 created by the current flow diverter. This leads to a controlled heat generation at a well-defined location that partially quenches the cross-section of the superconducting layer, bringing it into an even more resistive state, which further increases the NZPV and greatly reduces the risk of a hot spot.

The highly resistive layer acts as a current flow diverter because it forms a barrier so as to deviate the electrical current towards a desired path, i.e. one or more current paths. This is actually counter-intuitive, since a material with very high electrical resistivity is added in order to reduce the increase of local temperature generated by the Joule effect. Indeed, common sense would dictate that a material having the lowest resistivity should be used to reduce the elevation of local temperature, but the present concept shows the contrary, thus allowing several types of highly resistive materials to be used in numerous possible architectures for the segment. This provides added flexibility, since it increases the chance of compatibility with various fabrication processes of superconducting segments for mass production. Experimental results obtained show that a more than thirty times higher NZPV, compared to the architecture depicted in FIG. 1a, can be attained using the architecture presented in FIG. 2a, thus increasing the robustness of the superconducting segment and rendering it less sensitive to hot spots. This opens up the possibility to reduce the quantity of stabilizer presently used to protect the segment from hot spots, which allows one to reduce the production costs of the segment. It also renders the segment more resistive overall, thereby reducing the total length of segment required in a superconducting FCL application.

Figure 2A:
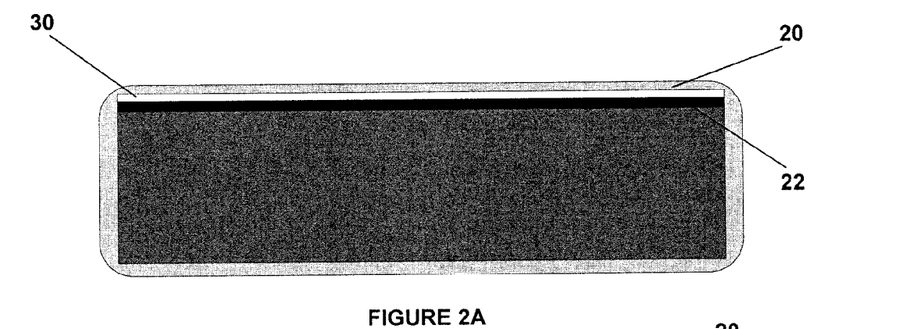
FIG. 2a is a first exemplary architecture, with a fully surrounding stabilizer and a highly resistive layer (acting as a "current flow diverter") on top of a superconducting layer.
Figure 2B:
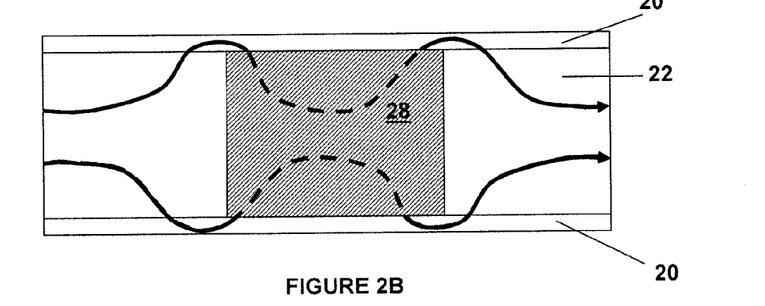
Figure 2C:
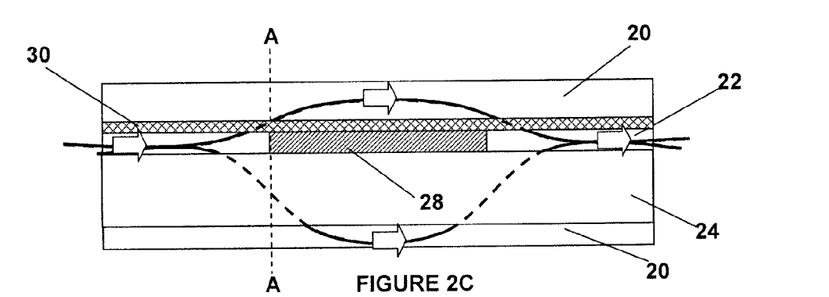
Figure 2D:
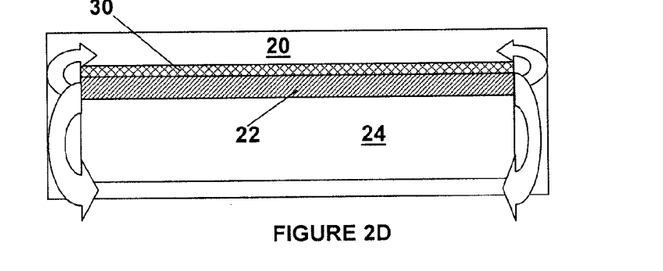

FIG. 2a illustrates a first exemplary embodiment of the superconducting segment, with a highly resistive layer 30 acting as a current flow diverter. In this embodiment, the highly resistive layer 30 is placed along the entire surface of the superconducting layer 22, but without blocking the current path between the superconducting layer 22 and the stabilizer 20 at the outer edges of the layer 22. The electrical resistance is therefore at a minimum level at these outer edges, forcing the current to be diverted into the stabilizer in these regions. As per the top view of FIG. 2b, the current is diverted towards these outer edges of the superconducting segment into the stabilizer 20 before it encounters the normal zone 28. It then naturally flows back towards the center of the superconducting segment while inside the stabilizer 20 over the normal zone 28 and the highly resistive layer 30 (dashed lines), and is again forced back towards the outer edges of the superconducting segment to then re-enter the superconducting layer 22. The highly resistive layer 30 therefore diverts the current towards the only areas of contact between the superconducting layer 22 and the stabilizer 20. As per FIG. 2c, the current appears to be diverted in a manner similar to that of FIG. 1c, however, the cross-sectional view of FIG. 2d shows that the path taken by the current to transfer into the stabilizer 20 is clearly different.

Figure 3A:
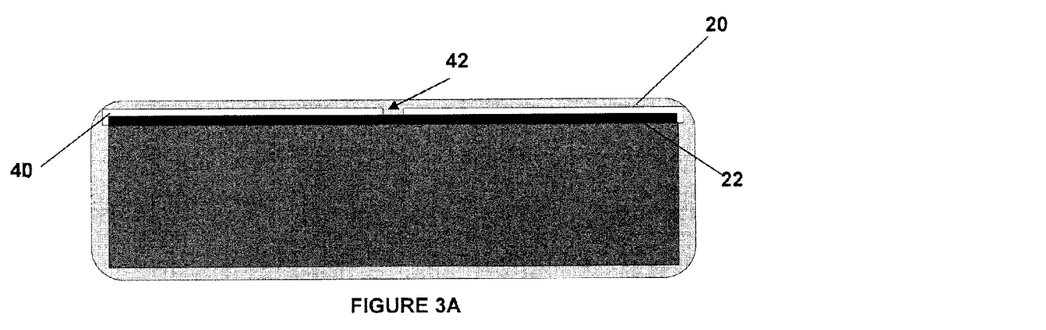
FIG. 3a is a second exemplary architecture, where the current flow diverter covers both outer edges of the superconducting layer and presents an aperture along the center of the superconducting layer.
Figure 3B:
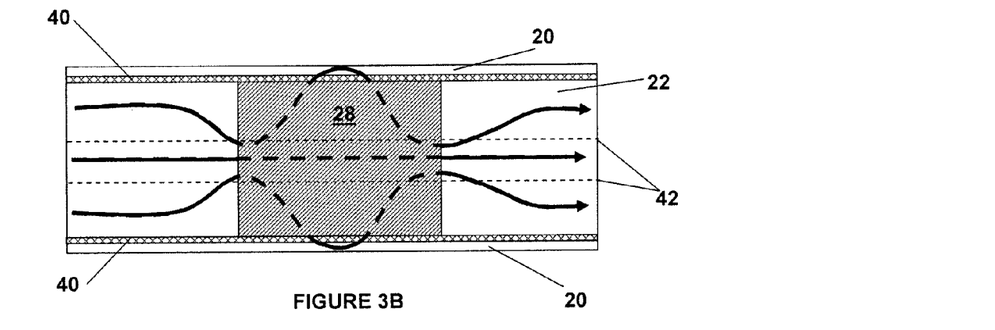
Figure 3C:
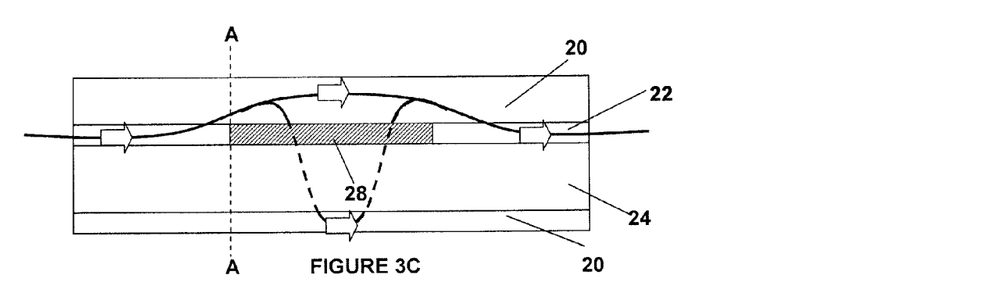
Figure 3D:
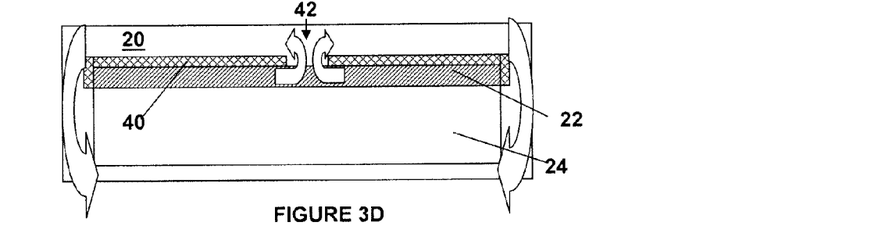

FIG. 3a is a second exemplary embodiment of the superconducting segment with a current flow diverter. A highly resistive layer 40 is separated into two portions, a first portion and a second portion, and provides a single current path for the current to flow from the superconducting layer 22 to the stabilizer 20 via an aperture 42 separating the first and the second portions. The highly resistive layer 40 partially covers the superconducting layer 22 and fully covers the outer edges thereof, contrary to the embodiment illustrated in FIG. 2a. The contact resistance is therefore at a minimum in the region of the aperture 42 and current is diverted into the stabilizer 20 at this region. As per the top view of FIG. 3b, the current is directed towards the aperture 42 just before the normal zone 28, flows freely in the stabilizer 20, and is redirected back through the aperture 42 to re-enter the superconducting layer 22 after the normal zone 28. The longitudinal side view of FIG. 3c (in the plane of the aperture 42) shows the current diversion towards the stabilizer 20 around the highly resistive layer 40, and the cross-sectional view FIG. 3d taken along lines A-A from FIG. 3c illustrates the path taken by the current to go from the superconducting layer 22 to the stabilizer 20.

Figure 4A:
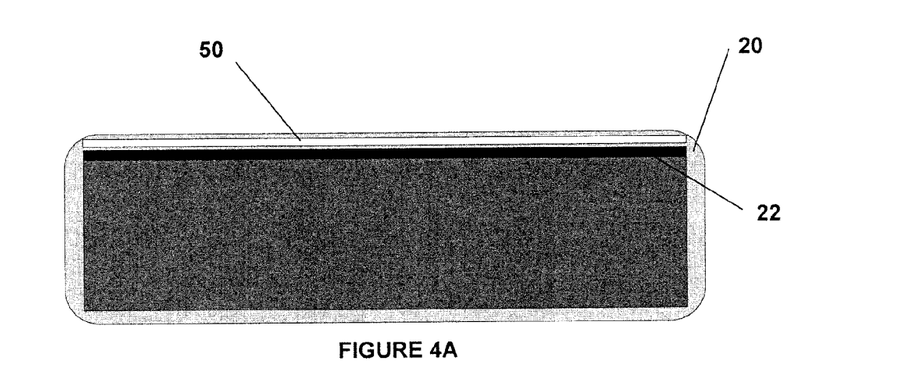
FIG. 4a is a third exemplary architecture, with the current flow diverter embedded in the stabilizer.

FIG. 4a is a third exemplary embodiment of the superconducting segment with a current flow diverter. A highly resistive layer 50 is embedded inside the stabilizer 20, thereby "separating" the stabilizer 20 into two parts (above and below the highly resistive layer 50) and increasing the contact resistance between the superconductor 22 and the portion of the stabilizer 20 above the highly resistive layer 50. This architecture offers two different current paths for the current from the superconducting layer 22 to the stabilizer 20. The first path is similar to that found in FIGS. 2a to 2d, whereby the current is forced towards the outer edges of the superconducting segment at the point of contact between the superconducting layer 22 and the upper portion of the stabilizer 20. This is the point of least resistance for the current to cross over from one layer to the other. The second path is of similar or higher resistance than the outer edges of the superconducting layer 22, but may be of sufficiently low resistance to allow the current to pass through it. Since the highly resistive layer 50 is embedded inside the stabilizer 20 and not in direct contact with the superconducting layer 22, some current may enter directly into the stabilizer 20 from the superconducting layer 22 in the region below the highly resistive layer 50. Note that the highly resistive layer 50 embedded inside the stabilizer 20 may have other configurations, such as those illustrated in FIGS. 3a and 5a.

Figure 4B:
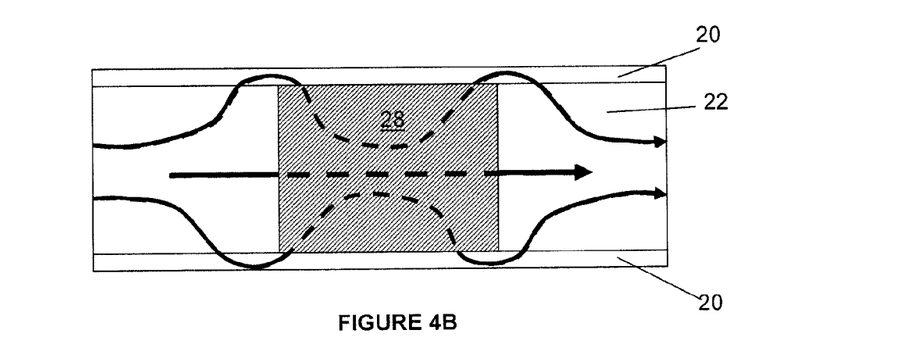
Figure 4C:
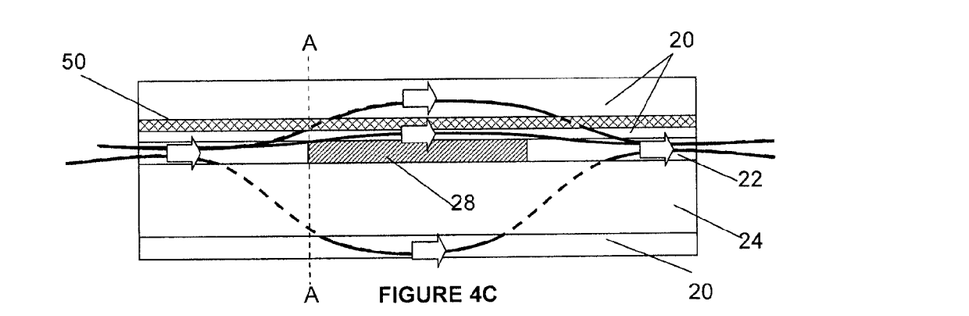
Figure 4D:
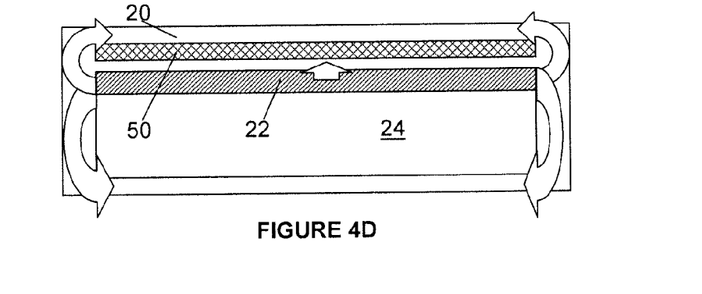

As per the top view of FIG. 4b, the current is diverted towards the outer edges of the superconducting segment into the stabilizer 20 before it encounters the normal zone 28. It naturally flows back towards the center of the segment while inside the stabilizer 20 to pass over the normal zone 28, and is again forced back towards the outer edges of the superconducting segment to re-enter the superconducting layer 22. The longitudinal side view of FIG. 4c shows the current diversion towards the stabilizer 20 around the highly resistive layer 50, and the cross-sectional view FIG. 4d taken along lines A-A from FIG. 4c illustrates the path taken by the current to go from the superconducting layer 22 to the stabilizer 20.

Figure 5A:
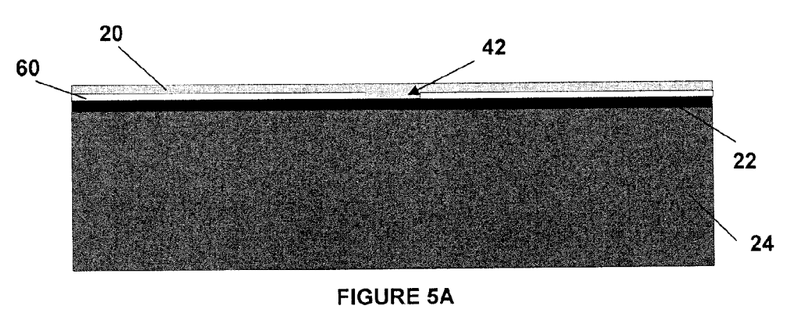
FIG. 5a is a fourth exemplary architecture, with the stabilizer being provided only on top of the current flow diverter, and the current flow diverter having an aperture along a length thereof.
Figure 5B:
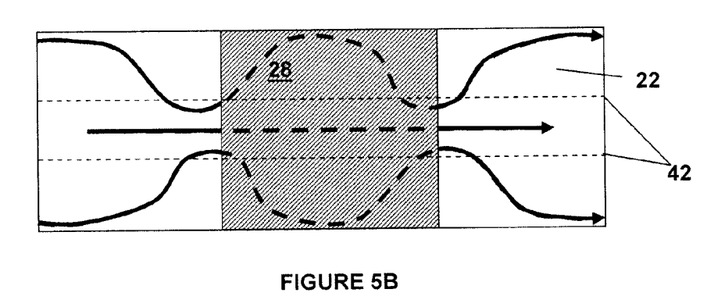
Figure 5C:
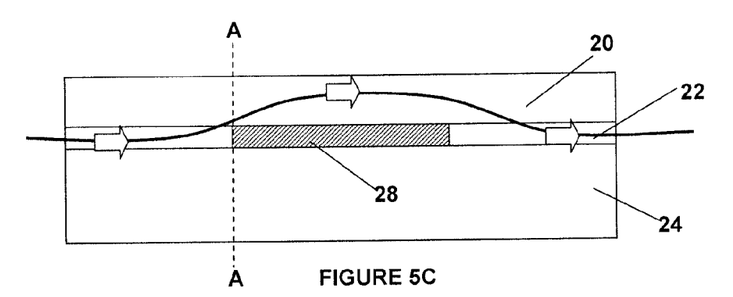
Figure 5D:
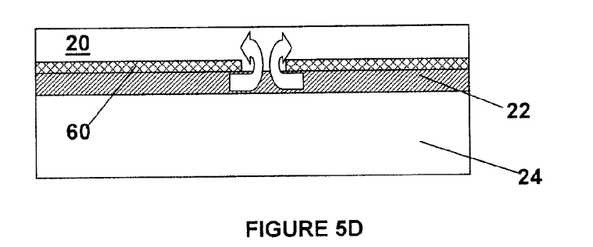

FIG. 5a is yet another embodiment of the superconducting segment with a current flow diverter 60. In this embodiment, the stabilizer 20 is only a single layer located on top of the resistive layer 60, without encompassing the remainder of the superconducting segment. Therefore, there is no side contact with the superconducting layer 22 and no contact at all with the substrate 24. The highly resistive layer 60 partially covers the superconducting layer 22 and provides a current path from the superconducting layer 22 to the stabilizer 20 via the aperture 42. The contact resistance is therefore at a minimum in the region of the aperture 42, and current is diverted into the stabilizer 20 at this region. As per the top view of FIG. 5b, the current is directed towards the aperture 42 just before the normal zone 28, flows freely in the stabilizer 20, and is redirected back through the aperture 42 to re-enter the superconducting layer 22 after the normal zone 28. The longitudinal side view of FIG. 5c (in the plane of the aperture 42) shows the current diversion towards the stabilizer 20 around the resistive layer 60, and the cross-sectional view FIG. 5d taken along lines A-A from FIG. 5c illustrates the path taken by the current to go from the superconducting layer 22 to the stabilizer 20.

It will be understood that other embodiments may also be provided using one or more highly resistive layers. By increasing the contact resistance between the superconducting layer 22 and the stabilizer 20 and causing the current to deviate into the stabilizer over a greater distance along the segment than it would have without the highly resistive layer or layers, the normal zone 28 spreads more quickly throughout the superconductor 22. This causes an increase in the normal zone propagation velocity (NZPV) and reduces the possible appearance of hot spots. In addition, forcing the current into the stabilizer through a narrow region of the stabilizer 20 via the current paths defined by the current flow diverter increases the current density in this local region, thereby temporarily generating heat at the superconducting-normal interface. The heat generated in this local region results in a higher NZPV, and it reduces the possibility of hot spots.

Some exemplary materials for the substrate 24 include, but are not limited to, super-alloys or high-performance alloys such as Hastelloy™, Nickel alloys, and stainless steel. Some exemplary materials for the superconductor 22 are, but are not limited to, (Re)BaCuO, such as YBaCuO, SmBaCuO, GdBaCuO, etc (where "Re" stands for "rare earth"). The stabilizer 20 may be a metal such as Silver (Ag), Copper (Cu), or any other type of non-magnetic metal with high thermal and electrical conductivities. The highly resistive layer 30, 40, 50, 60 may be composed of any suitable electrically insulating (dielectric) material, such as but not limited to $SiO_2$, $Al_2O_3$, $ZrO_2$, MgO, AlN or other oxides, mixed oxides, nitrides, or other suitable inorganic compounds. The highly resistive layer 30, 40, 50, 60 may also be composed of doped or undoped semiconductors such as but not limited to Si, Ge, SiC, SiN, diamond-like carbon (DLC), etc. For example, the thermal conductivity of doped nano-crystalline Silicium (nC-Si), MgO or AlN is relatively high at the temperature of liquid nitrogen, which is favorable for heat propagation during the quench, and its electrical resistivity can readily be controlled so as to meet the present requirements.

The resistive layer constituting the flow diverter 30, 40, 50, 60 can be made of any material with a resistivity that renders the electrical resistance between the stabilizer 20 and the superconducting layer 28 much higher than the resistance of the current path that goes around the flow diverter. In accordance with another embodiment, the highly resistive layer 30, 40, 50, 60 may be created using a natural degradation of the superconductor layer 22 when exposed to air, thereby causing layers of $Ba(OH)_2$ and/or $BaCO_3$ or others compounds to be formed thereon. Any material having a resistivity greater than the natural interface resistance between the superconducting layer and the stabilizer layer of the superconducting segment may be used for the highly resistive layer 30, 40, 50, 60. For example, a commercially available 2G HTS CC typically has a contact resistance of about 50 n$\Omega$ cm$^2$ at 77° K between the superconducting layer and the stabilizer.

Figure 6A:
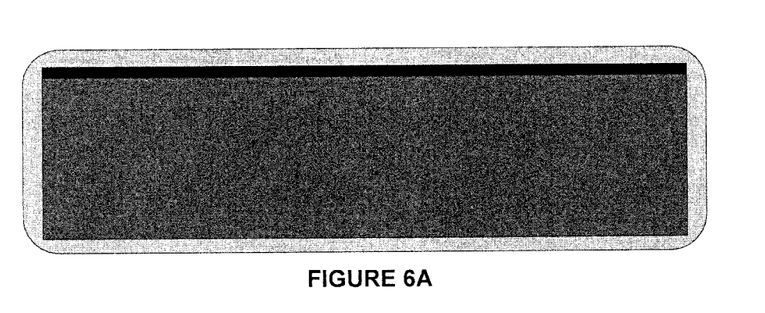
FIGS. 6a to 6d illustrate an exemplary process for introducing the current flow diverter inside the superconducting segment.

FIGS. 6a to 6d illustrate one exemplary method for introducing the highly resistive layer into a superconducting segment. FIG. 6a illustrates a commercially available 2G HTS CC. A 1 µm-thin layer of superconductor was deposited onto a metallic substrate on which about 150 nm of oxide (buffer) layers were previously deposited. A very thin layer of a non-magnetic metal, such as Silver (Ag), was then deposited onto the thin layer of superconductor. This first Ag layer protects the superconducting layer while remaining permeable to oxygen. The segment was then heat-treated in oxygen gas, so that the superconductor attained the required state of oxidation (stoichiometry) to ensure the desired superconducting properties. A thicker Ag layer (i.e. 1 or 2 µm) was then deposited onto the first Ag layer, whereby the second was intended to act as the stabilizer.

Figure 6B:
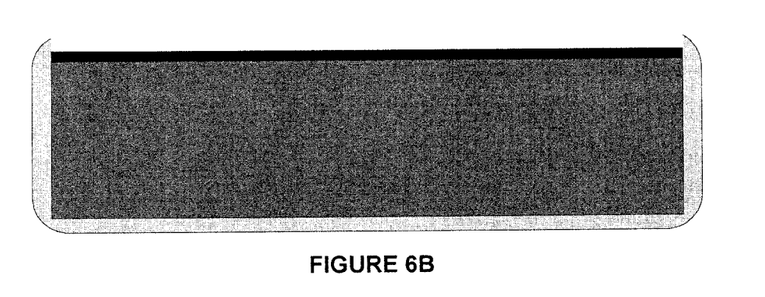
Figure 6C:
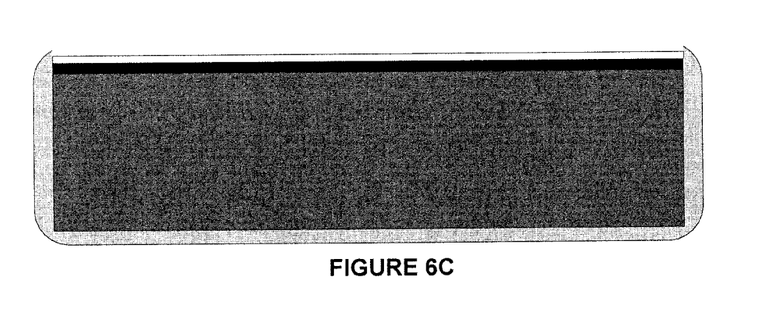
Figure 6D:
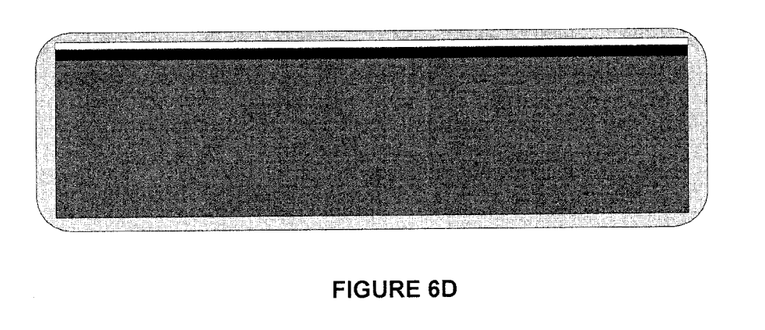

FIG. 6b illustrates the superconducting segment after the stabilizer was removed by etching. FIG. 6c presents a highly resistive layer that was formed on the bare superconducting layer by exposure to a suitable liquid or a gas for an appropriate period of time (minutes, to hours or days, depending on conditions). A new stabilizing layer was then deposited onto the highly resistive layer, as illustrated in FIG. 6d.

In an alternative embodiment, the highly resistive layer is deposited directly onto the superconductive layer or onto the thin first layer of Silver deposited before the oxidative heat-treatment of the superconducting segment. The highly resistive layer is then covered with a stabilizing layer. The highly resistive layer may be patterned using a mask during the deposition or using various etching techniques, or laser ablation.

In another alternative embodiment, the current flow diverter can consist of several highly resistive layers separated by stabilizing layers. Any geometrical arrangements of one or several highly resistive layers, implying an increase of the contact resistance between the superconductor and the stabilizer, may be used. Also, any geometrical arrangements of one or several highly resistive layers leading to a concentration of the current when it transits from the superconducting layer to the stabilizer may be used.

In yet another alternative embodiment, in addition to having the current flow diverter as described above, an interfacial contact resistance between the superconducting layer and the stabilizer at the local region of contact may be varied (i.e. increased or decreased), while remaining much lower than the resistance of a path passing through the current flow diverter, in order to vary the NZPV.

In some embodiments, the current flow diverter can be inserted in a multi-filamentary 2G HTS CC, which is used in applications requiring low AC losses.

Various techniques may be used to create and/or deposit the highly resistive layer or layers onto the superconducting layer. For example, it may be deposited by chemical vapor deposition (CVD), plasma-enhanced CVD (PECVD), chemical solution deposition (CSD), sputtering, pulsed laser deposition (PLD), etc. In some embodiments, the highly resistive layer is first deposited and then partially (or locally) etched (chemically or physically), for example, by using sputtering or laser ablation. Alternatively, the highly resistive layer may be created by modifying the surface of the superconducting layer, for instance by amorphizing the surface. Such degradation may be done in several ways, such as by aging in a gas (for example, air, $CO_2$, $N_2$, $O_2$, etc), or by exposing it to a suitable non-equilibrium plasma treatment in a suitable gas or gas mixture, or to ion bombardment with reactive or inert gas ions (for example, ions from a noble gas such as He, Ar, Ne, etc, or reactive gases such as $H_2$, $O_2$, etc), or by deliberately causing a chemical reaction at the surface of the superconducting layer with the appropriate liquid or gas. The plasma ion bombardment treatments may take place directly on the surface of the superconductor, or through a thin layer of stabilizer.

The flow diverter can be omitted at specific locations along the length of the segment when the requirement of a very low interface resistance is more important than a high NZPV. For instance, at the locations where the current is injected in the segment, such as at both ends of the segment, a very low contact resistance may be desirable to minimize the heat generation. The current flow diverter can be omitted at these locations by, for instance, using a mask to prevent the deposition of the material used for the current flow diverter. Alternatively, if the current flow diverter is sufficiently thin, such as when it consists of a very thin degraded surface of the superconducting layer, it can be removed by annealing the segment in a flowing oxygen environment.

If the current flow diverter is embedded in the stabilizer such as in FIGS. 4a-4d, it can be easily removed at the desired locations, for instance, where the current is injected, by removing the current flow diverter and the stabilizer itself all at once using processes such as chemical etching, electropolishing, etc. Once the current flow diverter has been removed, a new stabilizer can be deposited using electrodeposition, evaporation, sputtering or any other suitable process.

Figure 7:
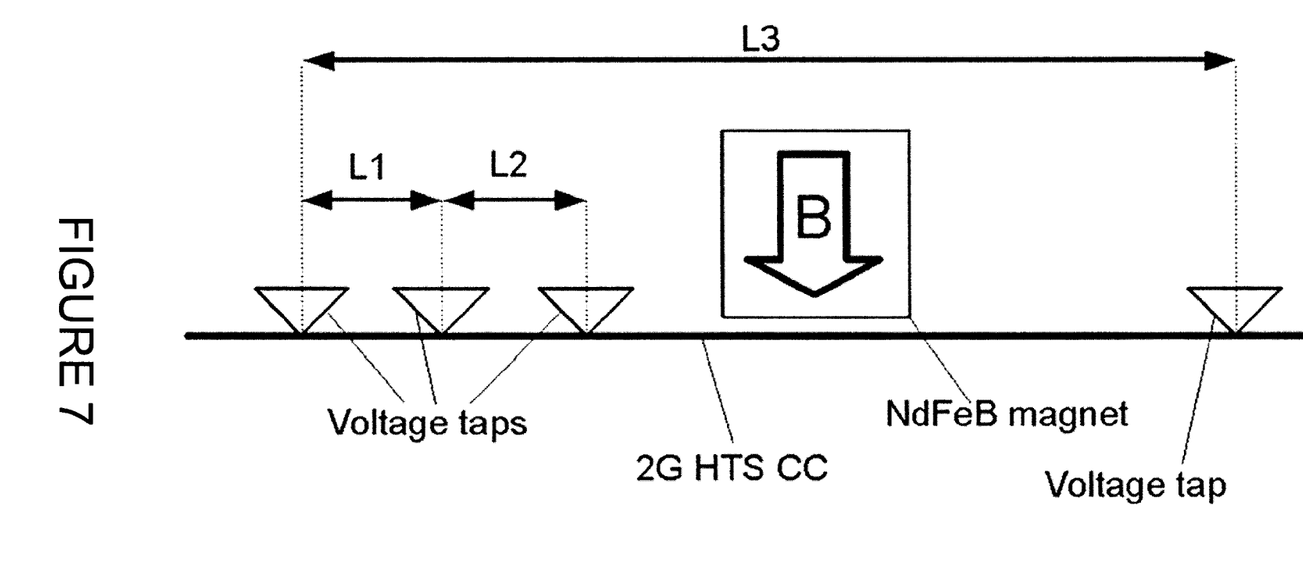
FIG. 7 illustrates an exemplary test setup to measure the NZPV of a superconducting segment.

FIG. 7 illustrates the experimental setup used to measure the NZPV of the above-described embodiments in the case of a 2G HTS CC. A permanent magnet was used to create a well-defined weak zone in the superconductor by causing a local reduction of the critical current. The voltage points were used to measure a potential difference between two points on the 2G HTS CC. The average electric field and the average resistance were deduced for each one of sections L1, L2, and L3. The same experimental setup can be reproduced for any class/type/kind of superconducting segment.

Figure 8:
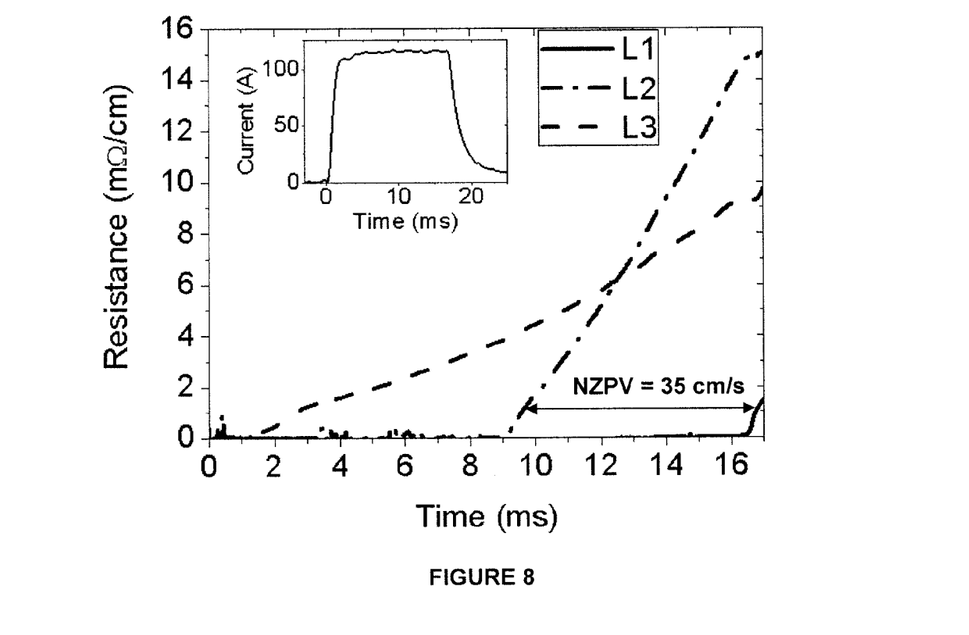
FIG. 8 is a graph showing resistance versus time for different sections of an unmodified superconducting segment.
Figure 9:
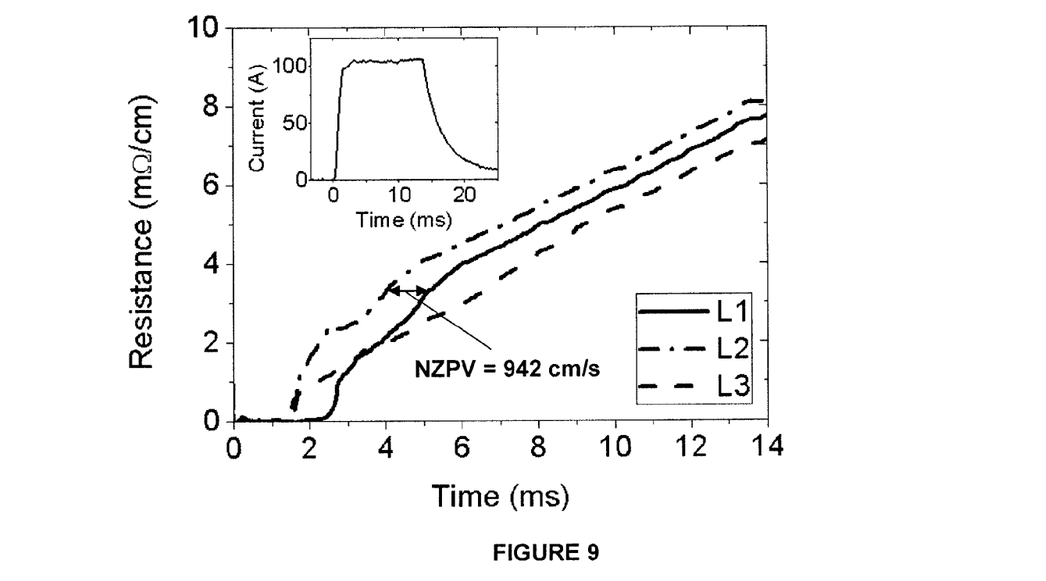
FIG. 9 is a graph showing resistance versus time for different sections of a superconducting segment in which a current flow diverter was inserted.

FIG. 8 is a graph illustrating the difference in resistance per unit length as a function of time when a constant current is applied through a 2G HTS CC superconducting segment without a current flow diverter, for a current l=115 A, and L1=2.5 mm, L2=2.5 mm, L3=19.7 mm. FIG. 9 is the same graph for a 2G HTS CC superconducting segment having a current flow diverter similar to the architecture presented in FIG. 2a, for a current I=105 A, and L1=10.1 mm, L2=9.5 mm, L3=47.7 mm. The NZPV of the superconducting segment with the current flow diverter has an NZPV of 942 cm/s, while the NZPV of the unmodified superconducting segment is 35 cm/s, showing an increase of almost 30 times. Other measurements also show that the local temperature at L2 of the modified superconducting segment (with the current flow diverter) is lower for a greater total resistance L3, compared to that of the unmodified superconducting segment.

NZPV measurements were also performed on a superconducting segment that was previously bombarded with Argon ions before the stabilizing layer was deposited thereon. A NZPV value of about 80 cm/s was measured, which is at least two to three times greater than that of an unmodified superconducting segment.

Figure 10:
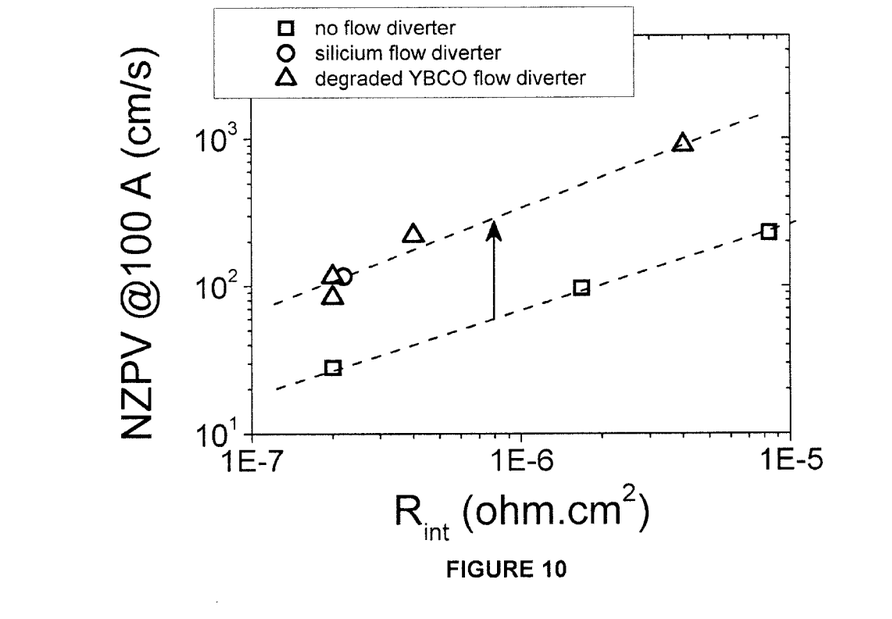
FIG. 10 is a graph illustrating measured NZPVs as a function of the contact resistance ($R_{int}$) between the stabilizer and the superconducting layer for different architectures containing a current flow diverter.

FIG. 10 is a graph illustrating measured NZPVs, when a current of 100 A is applied, as a function of the contact resistance ($R_{int}$) between the stabilizer and the superconducting layer for different architectures containing a current flow diverter. Square symbols correspond to the architecture presented in FIG. 5a, but without aperture 42 (no local region of contact between the stabilizer and the superconducting layer). This reference case is the benchmark used to assess the improvements provided by the modified superconducting segment described herein. Triangular symbols correspond to several 2G HTS CC having an architecture similar to those presented in FIGS. 2a and 3a. The circle corresponds to an architecture similar to that presented in FIG. 4a. It can be seen from this graph that, for a given contact resistance, the NZPV of the architectures comprising a flow diverter and having at least one local point of contact between the superconductor and the stabilizer is increased by approximately one order of magnitude as compared to the reference case, which has no local region of contact between the stabilizer and the superconducting layer.

The embodiments of the invention described above are intended to serve as examples only. The scope of the invention is therefore intended to be limited solely by those of the appended claims.

The invention claimed is:

1. A superconducting segment comprising:
   a substrate;
   a superconducting layer on the substrate, having a width and made of a material that undergoes a transition from a superconducting state to a normal state when its temperature (T) rises beyond a critical temperature ($T_c$),
   a stabilizer having an electrical resistance greater than the superconducting layer when T is below $T_c$ and lower than the superconducting layer when T is equal to or above $T_c$, and having an inner surface at least partly in contact with the superconducting layer and an opposed outer surface; and
   a current flow diverter having a greater electrical resistance than the stabilizer when T is below $T_c$, and located between the stabilizer and the superconducting layer or inside the stabilizer, the current flow diverter extending between the superconducting layer and the outer surface of the stabilizer along at least a portion of the width of the superconducting layer and having a first contact resistance along the portion of the width, and defining at least one current path from the superconducting layer to the outer surface of the stabilizer having a second contact resistance lower than the first contact resistance.

2. The superconducting segment of claim 1, wherein the stabilizer surrounds the substrate, the superconducting layer, and the current flow diverter.

3. The superconducting segment of claim 2, wherein the current flow diverter extends along all of the width of the superconducting layer and the at least one current path is defined along an outer edge of the superconducting layer.

4. The superconducting segment of claim 3, wherein the at least current path is also defined between the superconducting layer and the inner surface of the stabilizer.

5. The superconducting segment of claim 2, wherein the current flow diverter comprises a first portion extending from a first edge of the width of the superconducting layer towards a center, and a second portion extending from a second edge of the width opposite the first edge towards the center, the first portion and the second portion separated by an aperture defining the at least one current path.

6. The superconducting segment of claim 5, wherein the current flow diverter extends downwards beyond the first edge and the second edge of the superconducting layer to cover outer edges thereof.

7. The superconducting segment of claim 1, wherein the current flow diverter comprises a first portion extending from a first edge of the width of the superconducting layer towards a center, and a second portion extending from a second edge of the width opposite the first edge towards the center, the first portion and the second portion separated by an aperture defining the at least one current path.

8. The superconducting segment of claim 1, wherein the current flow diverter comprises a plurality of layers of electrically insulating material.

9. The superconducting segment of claim 8, wherein the plurality of layers of electrically insulating material are separated by non-magnetic metal layers.

10. A method for reducing non-uniform quenching in a superconducting segment, the superconducting segment having a substrate, a superconducting layer on the substrate made of a material that undergoes a transition from a superconducting state to a normal state when its temperature (T) rises beyond a critical temperature ($T_c$), and a stabilizer, the method comprising diverting current flowing through the superconducting layer into the stabilizer, when the superconducting layer is in the normal state, through at least one current path defined by a current flow diverter between the stabilizer and the superconducting layer or inside the stabilizer, the current flow diverter extending along at least a portion of the width of the superconducting layer, having a greater electrical resistance than the stabilizer when T is below $T_c$, and having a first contact resistance along the portion of the width, and the at least one current path having a second contact resistance lower than the first contact resistance.

11. The method of claim 10, wherein diverting the current through the at least one path comprises diverting the current along an outer edge of the superconducting layer.

12. The method of claim 10, wherein diverting the current through the at least one current path comprises diverting the current along an outer surface of the superconducting layer.

13. The method of claim 10, wherein diverting the current through the at least one current path comprises diverting the current between an inner surface of the stabilizer and an outer surface of the superconducting layer.

14. The method of claim 10, wherein diverting the current through the at least one current path comprises diverting the current along an outer edge of the superconducting layer and through at least one aperture in the current flow diverter along an outer surface of the superconducting layer.

15. The method of claim 10, wherein diverting the current through the at least one current path comprises diverting the current along an outer edge of the superconducting layer and between an inner surface of the stabilizer and an outer surface of the superconducting layer.

16. A method of fabricating a superconducting segment, the method comprising:
- depositing a superconducting layer on a substrate, the superconducting layer having a width and made of a material that undergoes a transition from a superconducting state to a normal state when its temperature T rises beyond a critical temperature $T_c$,
- providing a stabilizer at least partly in contact with the superconducting layer, the stabilizer having an electrical resistance greater than the superconducting layer when T is below $T_c$ and lower than the superconducting layer when T is equal to or above $T_c$; and
- providing a current flow diverter having a greater electrical resistance than the stabilizer when T is below $T_c$, and located between the stabilizer and the superconducting layer or inside the stabilizer, the current flow diverter extending between the superconducting layer and the outer surface of the stabilizer along at least a portion of the width of the superconducting layer and having a first contact resistance along the portion of the width, and defining at least one current path from the superconducting layer to the outer surface of the stabilizer having a second contact resistance lower than the first contact resistance.

* * * * *